(12) United States Patent
Salamone et al.

(10) Patent No.: US 10,720,373 B2
(45) Date of Patent: Jul. 21, 2020

(54) SEMICONDUCTOR POWER DEVICE WITH CORRESPONDING PACKAGE AND RELATED MANUFACTURING PROCESS

(71) Applicant: STMICROELECTRONICS S.R.L., Agrate Brianza (IT)

(72) Inventors: Francesco Salamone, Acireale (IT); Cristiano Gianluca Stella, San Gregorio di Catania (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 16/370,193

(22) Filed: Mar. 29, 2019

(65) Prior Publication Data
US 2019/0311976 A1 Oct. 10, 2019

(30) Foreign Application Priority Data
Apr. 5, 2018 (IT) .......................... 102018000004209

(51) Int. Cl.
*H01L 23/367* (2006.01)
*H01L 21/56* (2006.01)
(Continued)

(52) U.S. Cl.
CPC ........ *H01L 23/367* (2013.01); *H01L 21/4842* (2013.01); *H01L 21/56* (2013.01); *H01L 23/28* (2013.01); *H01L 23/3114* (2013.01); *H01L 23/3171* (2013.01); *H01L 23/34* (2013.01); *H01L 23/36* (2013.01); *H01L 23/3672* (2013.01); *H01L 23/3677* (2013.01); *H01L 23/3735* (2013.01); *H01L 23/3736* (2013.01);
(Continued)

(58) Field of Classification Search
CPC ......... H01L 23/28; H01L 23/31; H01L 23/34; H01L 23/36; H01L 23/367; H01L 23/3672; H01L 23/3677; H01L 23/373; H01L 23/3731; H01L 23/3735; H01L 23/3736; H01L 23/42; H01L 23/48; H01L 23/495
See application file for complete search history.

(56) References Cited

U.S. PATENT DOCUMENTS 6,236,098 B1 * 5/2001 Efland ..................... H01L 23/34
257/467
9,986,631 B2 * 5/2018 Rizza .................. H01L 23/3735
(Continued)

*Primary Examiner* — Eduardo A Rodela
(74) *Attorney, Agent, or Firm* — Seed Intellectual Property Law Group LLP

(57) ABSTRACT

A semiconductor power device has: a die, with a front surface and a rear surface, and with an arrangement of projecting regions on the front surface, which define between them windows arranged within which are contact regions; and a package, which houses the die inside it. A metal frame has a top surface and a bottom surface; the die is carried by the frame on the top surface; an encapsulation coating coats the frame and the die. A first insulation multilayer is arranged above the die and is formed by an upper metal layer, a lower metal layer, and an intermediate insulating layer; the lower metal layer is shaped according to an arrangement of the projecting regions and has contact projections, which extend so as to electrically contact the contact regions, and insulation regions, interposed between the contact projections, in positions corresponding to the projecting regions.

20 Claims, 5 Drawing Sheets

(51) Int. Cl.

| | |
|---|---|
| *H01L 23/31* | (2006.01) |
| *H01L 21/48* | (2006.01) |
| *H01L 23/433* | (2006.01) |
| *H01L 23/495* | (2006.01) |
| *H01L 23/373* | (2006.01) |
| *H01L 23/48* | (2006.01) |
| *H01L 23/34* | (2006.01) |
| *H01L 23/36* | (2006.01) |
| *H01L 23/42* | (2006.01) |
| *H01L 23/28* | (2006.01) |

(52) U.S. Cl.
CPC .......... *H01L 23/42* (2013.01); *H01L 23/4334* (2013.01); *H01L 23/48* (2013.01); *H01L 23/495* (2013.01); *H01L 23/49524* (2013.01); *H01L 23/49531* (2013.01); *H01L 23/49562* (2013.01); *H01L 23/49568* (2013.01)

(56) References Cited

U.S. PATENT DOCUMENTS

| | | | |
|---|---|---|---|
| 2006/0163648 A1 | 7/2006 | Hauenstein et al. | |
| 2006/0180916 A1* | 8/2006 | Wyland | H01L 23/04 257/691 |
| 2007/0138651 A1* | 6/2007 | Hauenstein | H01L 23/49838 257/782 |
| 2007/0290311 A1* | 12/2007 | Hauenstein | H01L 23/3735 257/685 |
| 2008/0054439 A1 | 3/2008 | Malhan et al. | |
| 2010/0133670 A1 | 6/2010 | Liu et al. | |
| 2010/0164078 A1 | 7/2010 | Madrid et al. | |
| 2011/0132431 A1* | 6/2011 | Linderman | H02S 40/42 136/246 |
| 2015/0255380 A1* | 9/2015 | Chen | H01L 23/49827 361/707 |
| 2015/0311144 A1* | 10/2015 | Williams | H01L 23/4952 257/675 |

* cited by examiner

SEMICONDUCTOR POWER DEVICE WITH CORRESPONDING PACKAGE AND RELATED MANUFACTURING PROCESS

BACKGROUND

Technical Field

The present disclosure relates to a semiconductor power device, in particular a power MOSFET (metal-oxide-semiconductor field-effect transistor) device, with a corresponding package and to a related manufacturing process.

Description of the Related Art

As is known, power MOSFET devices are widely used in applications, for example power conversion applications, in which they are subjected to biasing at high or very high voltages (with values of even 1000V-2000 V) and are traversed by currents that can switch rapidly.

Particular solutions for providing a corresponding package are thus specified so as to provide electrical insulation and an adequate separation distance between the leads associated to the gate, source and drain terminals and so as to ensure a desired heat dissipation towards the outside.

The power MOSFET devices are provided in a die of semiconductor material, typically silicon, which has a first main surface (rear surface) that carries a drain contact pad, or drain pad, and a second main surface (front surface), opposite to the first main surface, which carries contact pads, in particular source pads and gate pads.

The die is fixed to a conductive frame referred to as "leadframe", provided with leads for external connection of the MOSFET device terminals. In particular, the die is generally fixed to the leadframe by attaching the drain pad to a supporting portion of the leadframe, which also has a heat-dissipation function; leads are coupled to the gate and source pads by means of bonding wires or clips. The die/leadframe assembly is packaged in a mass of resin or some other insulating encapsulation material.

Traditional packages for power MOSFET devices are generally arranged vertically and comprise pins that project downwards from a bottom side of the package structure (which has a generically parallelepipedal shape), for electrical coupling to a PCB (Printed-Circuit Board). An appropriate heat sink, typically a metal plate, is coupled to the package structure, being also arranged vertically with respect to the PCB.

Current applications specify, however, increasingly often horizontal packages, of the SMD (Surface-Mounting Device) type, in order to obtain increasingly compact dimensions as regards the thickness. A high thermal efficiency is also desired of these packages, for heat dissipation, and a good electrical insulation.

On account of the extremely compact dimensions and small spaces, manufacturing of packages of this type proves, however, problematical.

BRIEF SUMMARY

One or more embodiments are directed to a power semiconductor device and a corresponding manufacturing process.

BRIEF DESCRIPTION OF THE SEVERAL VIEWS OF THE DRAWINGS

For a better understanding of the present disclosure preferred embodiments thereof are now described, purely by way of non-limiting example, with reference to the attached drawings, wherein.

DETAILED DESCRIPTION

Figure 1:
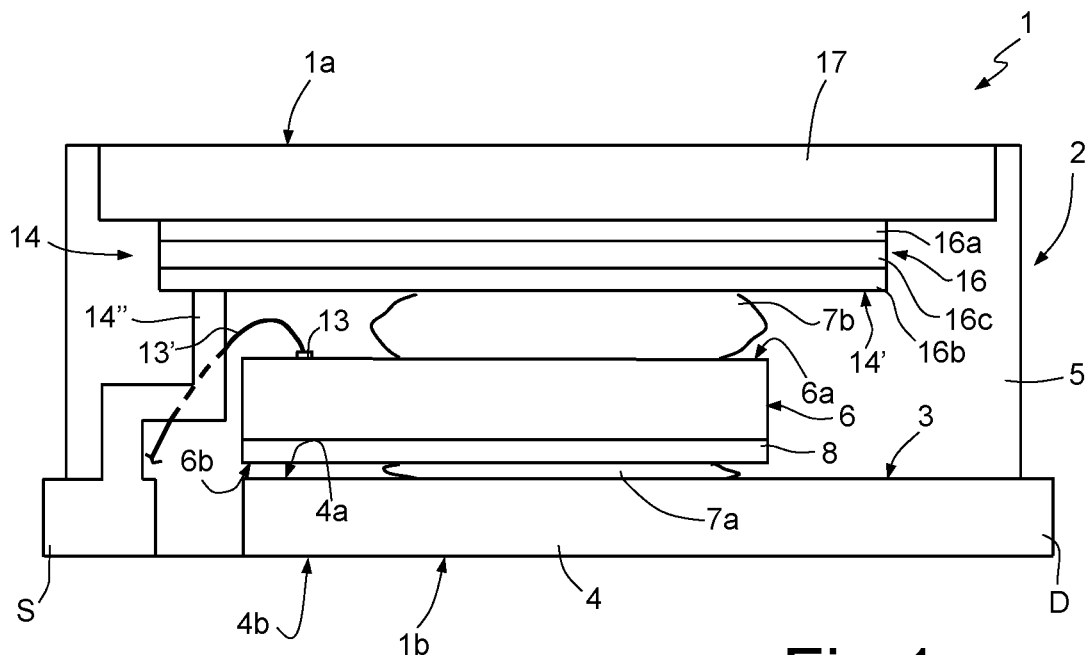
FIG. 1 is a schematic cross-sectional view of a semiconductor power device with a corresponding package of the SMD type, according to a first embodiment of the present solution.

With reference to FIG. 1, a first embodiment of a package 1 for a semiconductor power device 2, in particular a power MOSFET device is now disclosed. As will be highlighted hereinafter, the package 1 is in this case of the double-exposed type with dual-side cooling, with electrical insulation limited to just a top side.

The package 1 comprises a leadframe 3 provided with a frame 4, made up of a metal plate, for example of copper, having a top surface 4a and a bottom surface 4b. The bottom surface 4b of the frame 4 forms part of an exposed bottom surface 1b of the package 1, which can itself operate as heat sink or be coupled (in a way not illustrated herein) to an external heat sink so as to increase the heat dissipation capacity towards the outside.

The package 1 further comprises an encapsulation material 5, made of insulating material, for example epoxy resin, which covers and coats the frame 4 at the top (leaving, as mentioned previously, the bottom surface 4b thereof exposed) and in general defines the interface towards the outside of the package 1.

The semiconductor power device 2 comprises a die 6, having a front surface 6a and a rear surface 6b, the latter being coupled, via coupling with a first solder-paste layer 7a, to the top surface 4a of the frame 4 of the leadframe 3.

The die 6 comprises a body of semiconductor material, for example silicon, integrated in which are, in a known way not illustrated in detail herein, a plurality of MOSFET elementary units (or cells), arranged in strips and having a vertical, columnar, structure, each provided with a respective gate region and a respective source region that are arranged at the front surface 6a. The semiconductor material body constitutes a drain region of the MOSFET, and a drain metallization 8, in direct electrical contact with the body, coats the rear surface 6b of the die 6, constituting a drain pad of the same MOSFET.

The frame 4 of the leadframe 3 is in this case in electrical contact with the drain metallization 8 (hence not being electrically insulated); an external portion of the frame 4 protrudes from the encapsulation material 5 and defines at least one drain lead D of the semiconductor power device 2.

Figure 2A:
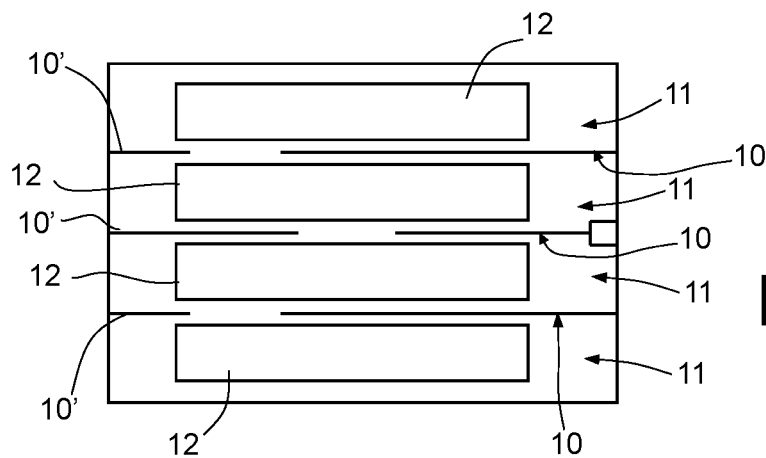
FIGS. 2A and 2B are schematic top plan views of a front surface of a die of the device of FIG. 1, in possible variant embodiments.

As shown schematically in FIG. 2A (and in a way not illustrated in detail in the aforesaid FIG. 1), gate metallization lines 10 (the so-called "gate fingers") are provided on the front surface 6a of the die 6, having a suitable distribution for enabling (in a known way, here not illustrated) biasing of all the gate regions of the MOSFET cells. The gate fingers 10, which may be continuous or, as in the example illustrated, have interruptions along their longitudinal extension, define between them (and on the front surface 6a of the die 6) top passivation areas 11, arranged within which are source contact regions 12 or windows (also referred to as "source pads"), in electrical contact with the source regions of the MOSFET cells (and isolated from the aforesaid gate fingers 10). In the example illustrated, the source contact regions 12 are arranged on the front surface 6a of the die 6 and are rectangular in plan view (in a horizontal plane in which the front surface 6a of the die 6 lies), moreover having mutually uniform dimensions.

The aforesaid source contact regions 12 are arranged within the top passivation areas 11 generally at the same height as the gate fingers 10, which are, however, subsequently covered by passivation regions 10' (in a way not illustrated in detail herein) and are hence raised with respect to the source contact regions 12 starting from the front surface 6a of the die 6.

One or more gate pads 13 (see once again FIG. 1), carried by the front surface 6a of the die 6 are moreover electrically connected to the gate fingers 10 and enable electrical biasing thereof from the outside. One or more gate leads (not illustrated in FIG. 1) are electrically connected, for example by means of electrical wires 13' within the encapsulation material 5, to corresponding gate pads 13.

In the example shown in FIG. 2A, three gate fingers 10 are present, which define top passivation areas 11, arranged within which are respective source contact regions 12. However, it is evident that the distribution and number of gate fingers 10, top passivation areas 11, and source contact regions 12 may vary according to the characteristics and specifications of the semiconductor power device 2.

Figure 2B:
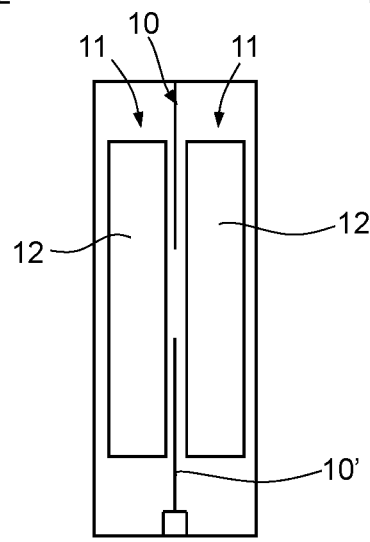

For instance, FIG. 2B illustrates a further example, in which a single gate finger 10 is provided on the front surface 6a of the die 6, which defines two top passivation areas 11 and two respective source contact regions 12 provided inside the same top passivation areas 11.

The package 1 of the semiconductor power device 2 further comprises (see again FIG. 1) a source clip 14, coupled, via a second solder-paste layer 7b, on the front surface 6a of the die 6 so as to be in electrical contact with the source contact regions 12, and moreover arranged so as to contact, laterally with respect to the die 6, one or more source leads S of the power device 2, which protrude, at least in part, from the encapsulation material 5.

According to a particular aspect of the present solution, a main portion 14' of the aforesaid source clip 14 is provided in a bottom layer of an insulation multilayer 16 (also referred to as a first multilayer stack), arranged above the die 6 to provide electrical insulation thereof with respect to an exposed top surface 1a of the package 1.

In the embodiment illustrated in FIG. 1, the aforesaid insulation multilayer 16 is a DBC (Direct-Bonded Copper) multilayer constituted by an upper metal layer 16a and a lower metal layer 16b, both of copper, and by an intermediate insulating layer 16c made of a ceramic material, for example alumina ($Al_2O_3$), or alternatively aluminum nitride (AlN) or beryllium oxide (BeO), coupled together by means of high-temperature eutectic direct bonding; the intermediate insulating layer 16c electrically insulates the top and bottom metal layers 16a, 16b completely.

The upper metal layer 16a of the insulation multilayer 16 (or, as in the example illustrated, an additional metal layer 17 coupled in contact onto the same upper metal layer 16a, for example via attaching or pressure bonding) forms part of the exposed top surface 1a of the package 1, which may operate itself as heat sink or be coupled (in a way not illustrated herein) to a further external heat sink so as to increase the heat dissipation capacity towards the outside.

The bottom layer 16b of the insulation multilayer 16 defines the main portion 14' of the source clip 14. The same source clip 14 further comprises a connecting portion 14", which connects the aforesaid main portion 14' to the one or more source leads S of the power device 2. This connecting portion 14" may be formed integrally with the main portion 14' or else be constituted by a distinct portion of metal material, which in the example is also made of copper, that extends laterally with respect to the die 6 and is coupled to the main portion 14'.

According to a particular aspect of the present solution, the aforesaid main portion 14' of the source clip 14 (or, likewise, the aforesaid lower metal layer 16b of the insulation multilayer 16) is suitably shaped so as to correspond to the conformation and arrangement of the gate fingers 10 (and to the corresponding passivation regions 10') present on the front surface 6a of the die 6 or, in other words, is shaped specularly with respect to the source contact regions 12.

Figure 3:
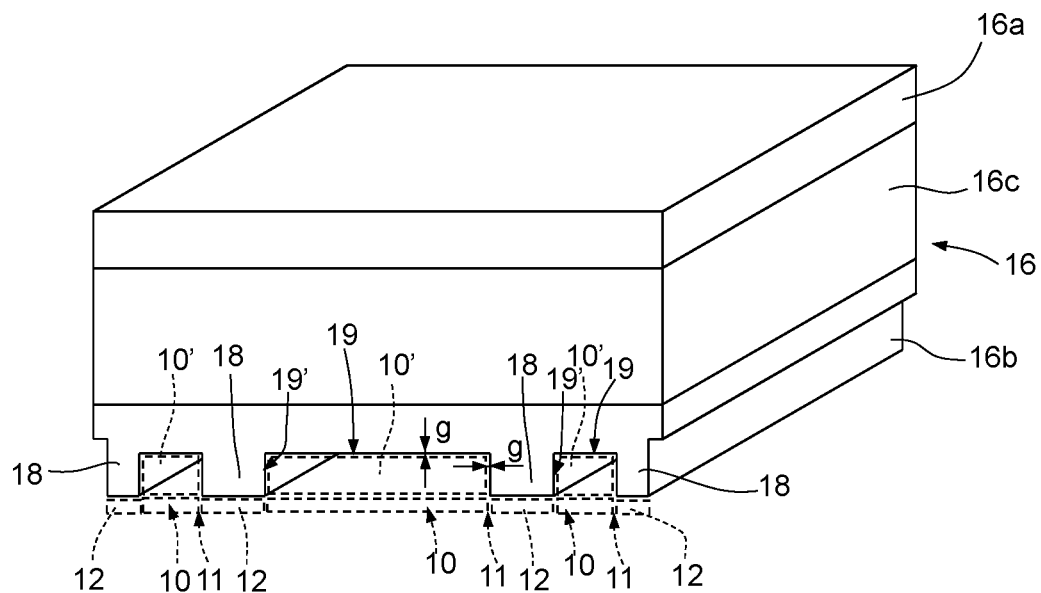
FIG. 3 is a schematic cross-sectional view of a portion of a source contact clip of the device of FIG. 1.

In detail, and with reference first to FIG. 3, the lower metal layer 16b of the insulation multilayer 16 has a comb-like conformation, having: contact regions 18, which extend as projections towards the underlying die 6 so as to come into electrical contact, at corresponding bottom surfaces, with the source contact regions 12 (when the insulation multilayer 16 is coupled on the front surface 6a of the die 6); and insulation regions 19, interposed between the contact regions 18 and arranged in positions corresponding to the gate fingers 10 above and not contacting the passivation regions 10' that coat the gate fingers 10, so as to bypass or pass over the same gate fingers 10, thus preventing damage to the passivation regions 10'.

In particular, the aforesaid insulation regions 19 are constituted by trenches 19', defined between the projections of the contact regions 18 and arranged so as to house, when the insulation multilayer 16 is coupled to the front surface 6a of the die 6, the passivation regions 10' on the gate fingers 10, without contacting them in any point, due to the presence of a separation gap, denoted as a whole by g in FIG. 3, between the passivation regions 10' on the gate fingers 10 and the side and bottom walls of the same trenches 19'.

In the example of FIG. 3, three trenches 19' are illustrated, having a non-uniform lateral extension. It is, however, evident that the number and conformation of the trenches 19' may differ according to the arrangement and conformation of the gate fingers 10 on the front surface 6a of the die 6 and of the corresponding source contact regions 12.

Figure 4:
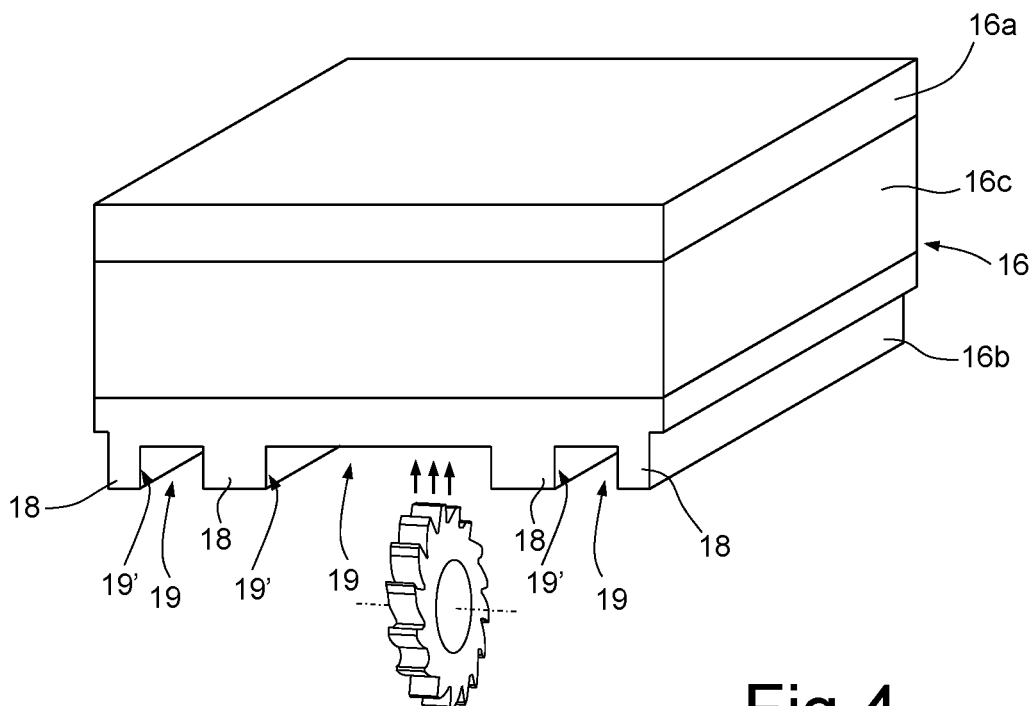
FIG. 4 is a schematic cross-sectional view of the source contact clip, during a possible manufacturing process.

As illustrated schematically in FIG. 4, shaping of the lower metal layer 16b of the insulation multilayer 16 may be obtained by sawing the lower metal layer 16b for the formation the trenches 19', after the same lower metal layer 16b has been coupled to the intermediate insulating layer 16c of the insulation multilayer 16.

Figure 5A:
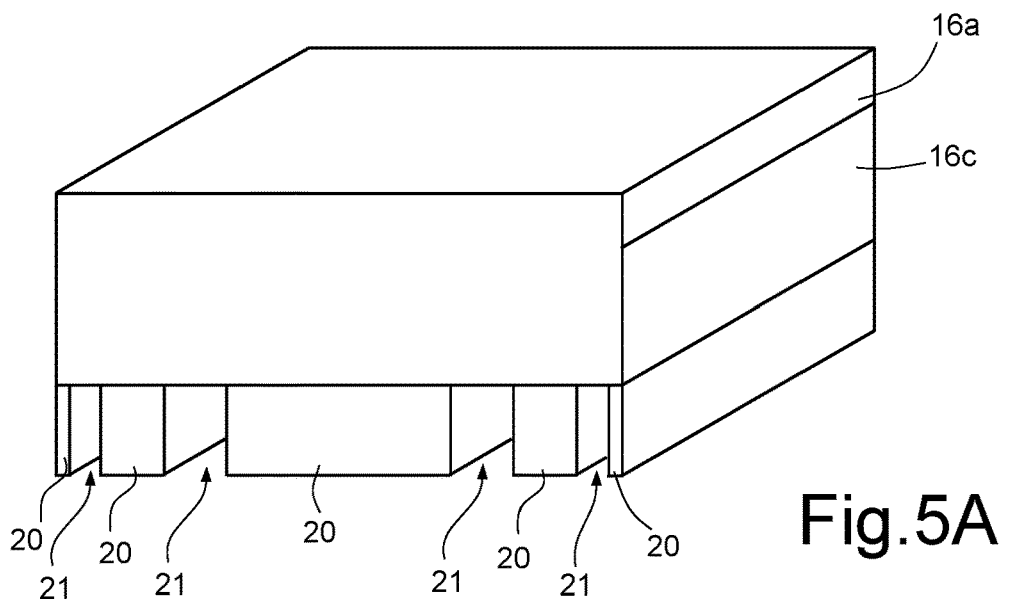
FIGS. 5A-5C are schematic cross-sectional views of the source contact clip, during successive steps of a different manufacturing process.

Alternatively, as illustrated schematically in FIG. 5A, deposition of adhesive strips 20 of an appropriate adhesive material may be envisaged on the intermediate insulating layer 16c of the insulation multilayer 16, prior to coupling of the lower metal layer 16b. In a way that is evident, these adhesive strips 20 are arranged and shaped in a way corresponding to the gate fingers 10 and have empty spaces 21 between them.

Figure 5B:
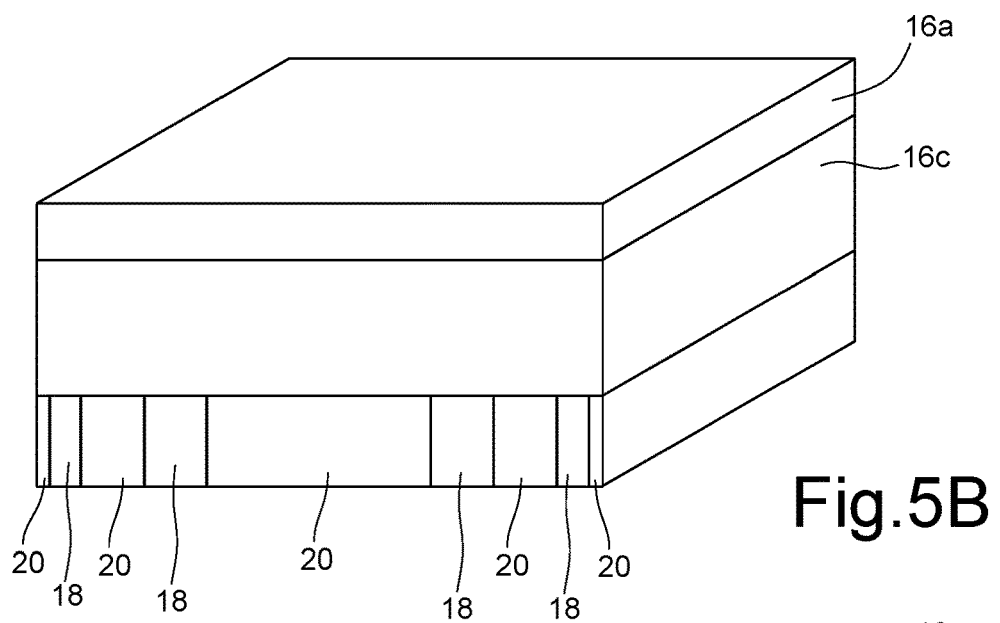

These empty spaces 21 are to be filled by the lower metal layer 16b for definition of the contact regions 18, as illustrated in FIG. 5B, when the lower metal layer 16b is coupled to the intermediate insulating layer 16c of the insulation multilayer 16.

Figure 5C:
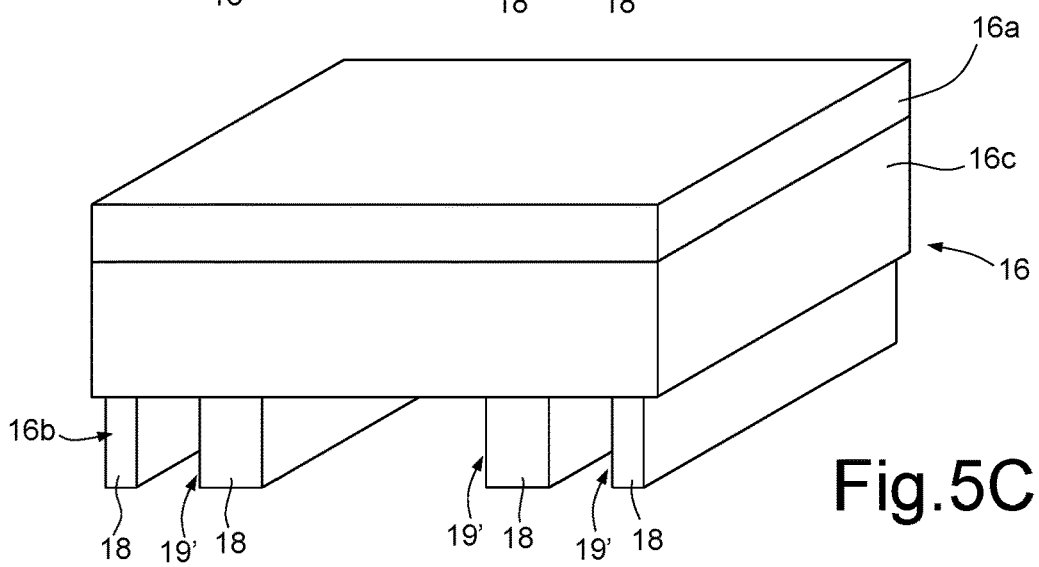

Afterwards, as illustrated in FIG. 5C, the adhesive strips 20 are removed, via detachment and separation from the intermediate insulating layer 16c so as to form the trenches 19' in the lower metal layer 16b.

Alternatively, the adhesive strips 20 can be removed only in part, in the case where the trenches 19', once the adhesive strips 20 have been partially removed, have a height such as to enable the presence of the separation gap g, preventing any contact between the passivation regions 10' on the gate fingers 10 and the remaining strips—thus preventing any damage to the passivation regions 10' during positioning of the source clip 14 on the front surface 6a of the die 6, arranging the bottom contact surfaces of the projections of the contact regions 18 to correspond to the source contact regions 12.

Figure 6:
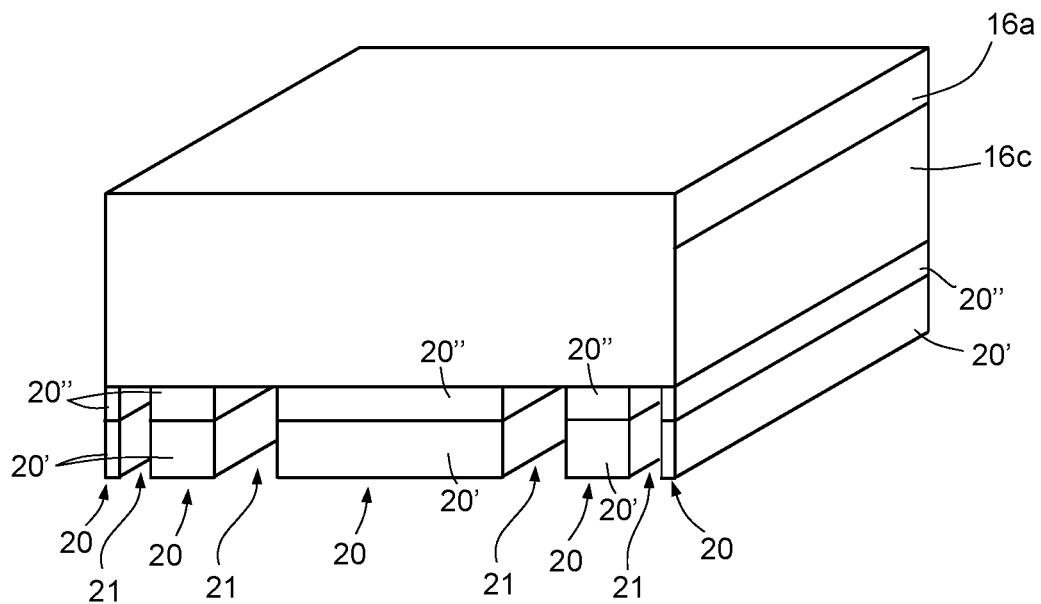
FIG. 6 is a schematic cross-sectional view of the source contact clip, in a further variant embodiment.

In this case, as illustrated schematically in FIG. 6, definition of the adhesive strips 20 may be envisaged, with first portions 20', designed to be removed and detached for definition of the trenches 19', and with second portions 20", made of a material different from that of the first portions, consisting of a permanent adhesive, which are to remain in contact with the intermediate insulating layer 16c after detachment of the first portions 20'. In this case, the aforesaid second portions 20" define a respective bottom wall of the trenches 19'.

Figure 7:
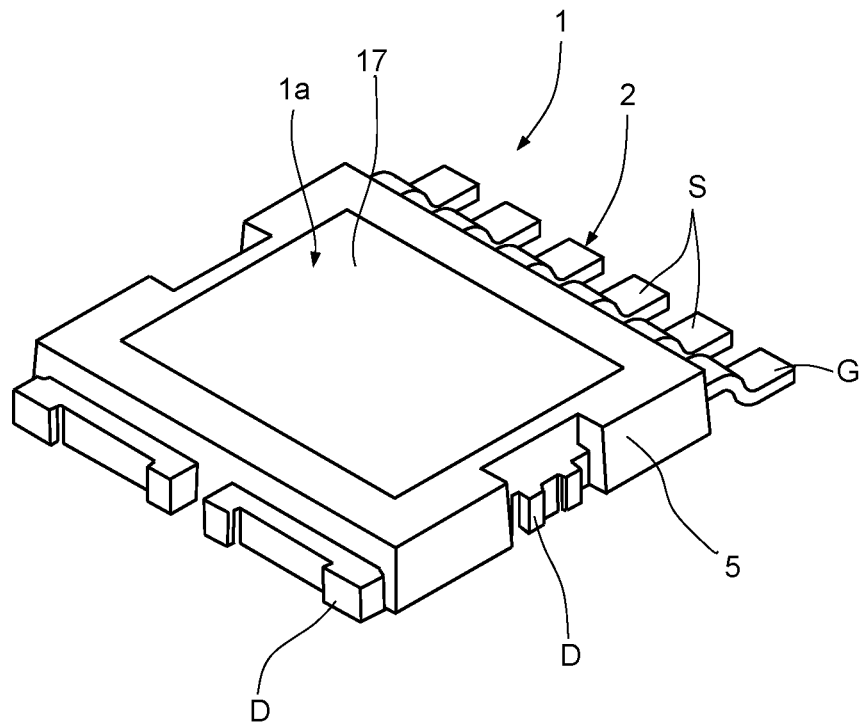
FIG. 7 is a perspective view of the package of the device of FIG. 1, in a first variant embodiment.

The package 1 of the semiconductor power device 2 is represented schematically in FIG. 7, in this case in a version with protruding leads, among which in particular the source lead S and the drain lead D, as well as one or more gate leads G.

In the same FIG. 7, the exposed portion of the additional metal layer 17 coupled at the top in contact with the upper metal layer 16a of the insulation multilayer 16 is also shown, which provides a heat-dissipation surface external to the package 1, electrically insulated from the terminals of the semiconductor power device 2.

Figure 8:
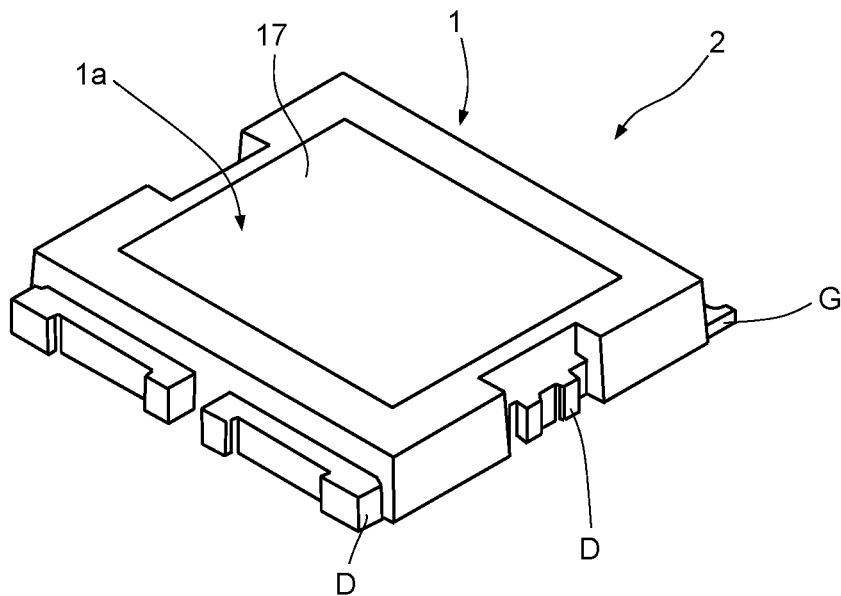
FIG. 8 is a perspective view of the package of the device of FIG. 1, in a second variant embodiment.

FIG. 8 shows, instead, an alternative version of the package 1 of the semiconductor power device 2, of the leadless type, which does not differ, as regards construction thereof, from what has been illustrated previously.

The process for manufacturing the semiconductor power device 2 hence envisages the following consecutive steps:

providing the leadframe 3, with definition of the corresponding frame 4 and of the source and gate leads S and G;

depositing the first solder-paste layer 7a on the top surface 4a of the frame 4;

positioning the die 6 (in which the cells of the MOSFET have previously been formed in a known way here not described in detail) and coupling it by soldering to the frame 4 of the leadframe 3;

depositing the second solder-paste layer 7b on the front surface 6a of the die 6;

positioning the insulation multilayer 16 on the front surface 6a of the die 6, with adhesion of the lower metal layer 16b (which has previously been machined and shaped in a way corresponding to the passivation regions 10' coating the gate fingers 10, as discussed previously in detail) to the front surface 6a, by means of the aforesaid second solder-paste layer 7b that sets the bottom contact surfaces of the projections of the contact regions 18 in metallic (and hence electrical) contact with the source contact regions 12;

positioning and coupling the source clip 14 (in particular, the corresponding connecting portion 14") to the one or more source leads S of the semiconductor power device 2; and forming the encapsulation material 5 for definition of the package 1 of the semiconductor power device 2.

Figure 9:
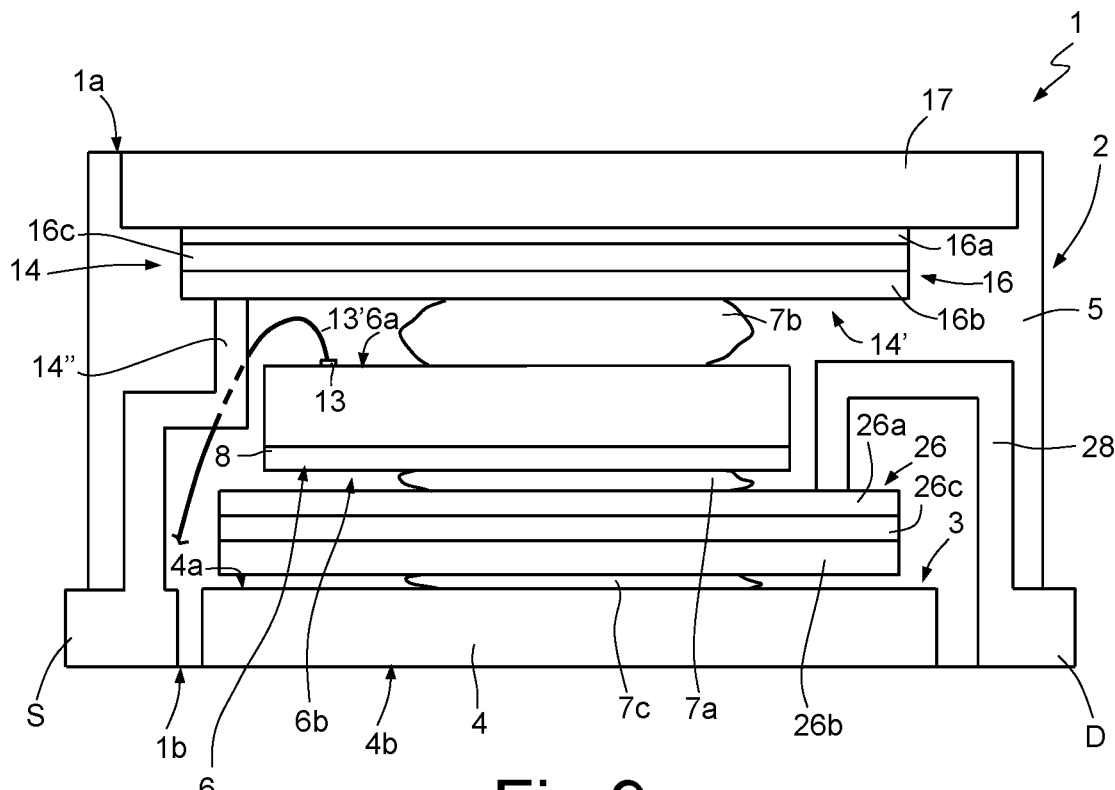
FIG. 9 is a schematic cross-sectional view of a semiconductor power device with a corresponding package of the SMD type, according to a second embodiment of the present solution.

With reference to FIG. 9, a second embodiment of the present solution is now described with reference to a package 1, once again of a double-exposed dual-side-cooling type, in this case with double electrical insulation, both on the exposed top surface 1a and on the exposed bottom surface 1b.

In detail, the package 1 differs from what has been illustrated with reference to the first embodiment in that it comprises a further insulation multilayer (also referred to as a second multilayer stack), designated by 26, arranged in this case between the rear surface 6b of the die 6 and the top surface 4a of the frame 4 of the leadframe 3.

Also in this case, the aforesaid further insulation multilayer 26 is a DBC (Direct-Bonded Copper) multilayer constituted by a respective upper metal layer 26a and a respective lower metal layer 26b, both made of copper, and a respective intermediate layer 26c made of ceramic material, for example alumina ($Al_2O_3$), or alternatively aluminum nitride (AlN) or beryllium oxide (BeO), coupled together by means of high-temperature eutectic direct bonding; the intermediate layer 26c also in this case electrically insulates the top and bottom metal layers 26a, 26b completely.

In particular, the lower metal layer 26b is in this case coupled to the top surface 4a of the frame 4, by means of a third solder-paste layer 7c, whereas the upper metal layer 26a is coupled to the rear surface 6b of the die 6 by means of the first solder-paste layer 7a (hence being in contact with the drain metallization 8 of the semiconductor power device 2). Alternatively, and in a way not illustrated in the aforesaid FIG. 9, the further insulation multilayer 26 may constitute, with its lower metal layer 26b, the leadframe 3, exposed, directly and at the bottom, towards the outside, not covered by the encapsulation material 5 (there being in any case full correspondence and metallic continuity between the aforesaid lower metal layer 26b and the frame 4 of the leadframe 3).

In this embodiment, the drain terminal is electrically insulated from the frame 4 of the leadframe 3, and a drain clip 28 is hence present, which electrically connects at least one drain lead D that protrudes in part from the encapsulation material 5, to an outer portion of the upper metal layer 26a of the further insulation multilayer 26 (not overlaid by the die 6).

In this case, the manufacturing process hence envisages the following consecutive steps:

providing the leadframe 3, with definition of the corresponding frame 4 and of the source, gate, and drain leads S, G, and D;

depositing and attaching of the further insulation multilayer 26, by adhesion of the corresponding lower metal layer 26b to the top surface 4a of the frame 4, by means of the third solder-paste layer 7c (it should be noted that, in the variant in which the further insulation multilayer 26 defines, with the corresponding lower metal layer 26b, the frame 4 of the leadframe 3, use of this third solder-paste layer 7c is not envisaged);

positioning and coupling the drain clip 28 to the one or more drain leads D of the semiconductor power device 2;

depositing the first solder-paste layer 7a on the upper metal layer 26a of the further insulation multilayer 26;

positioning the die 6 (in which the cells of the MOSFET have previously been formed) and coupling it by means of soldering to the upper metal layer 26a of the further insulation multilayer 26;

depositing the second solder-paste layer 7b on the front surface 6a of the die 6;

positioning the insulation multilayer 16 on the front surface 6a of the die 6, with adhesion of the lower metal layer 16b (which has previously been processed and shaped in a way corresponding to the passivation regions 10' that overlie the gate fingers 10, as discussed previously) to the front surface 6a, by means of the aforesaid second solder-paste layer 7b, which sets the bottom contact surfaces of the projections of the contact regions 18 in metallic (and hence electrical) contact with the source contact regions 12;

positioning and coupling the source clip 14 (in particular, the corresponding connecting portion 14") to the one or more source leads S of the semiconductor power device 2; and forming the encapsulation material 5 for definition of the package 1 of the semiconductor power device 2, such as in a molding process.

The advantages of the discussed solution emerge clearly from what has been described previously.

In any case, it is pointed out that this solution allows to provide a semiconductor power device 2 having a package 1 having compact dimensions, for example with a maximum thickness in the vertical direction of just 2-3 mm.

Moreover, the package 1 advantageously affords the possibility of cooling on both sides (with possibility of marked heat dissipation), and electrical insulation of just the top side, or of both the bottom and top sides of the package 1.

Advantageously, due, in particular, to provision of the insulation multilayer 16, the distances of separation between the gate, source, and drain leads G, S, and D of the semiconductor power device 2 are high, for example around 5-7 mm, so as to obtain high insulation voltages, for example in the region of 1600 V for the package 1 with protruding leads or 2000 V for the package 1 without protruding leads.

Moreover, the on-state resistance $Rds_{on}$ of the semiconductor power device 2 is particularly low.

In general, the reliability and robustness of the semiconductor power device 2 are particularly high, without entailing high manufacturing costs.

The aforesaid advantages make use of the semiconductor power device 2 particularly recommended in numerous fields of application, amongst which the automotive field, the field of solar energy and energy storage, and the field of electrical energy conversion.

Finally, it is clear that modifications and variations may be made to what has been described and illustrated herein, without thereby departing from the scope of the present disclosure.

For instance, it is highlighted that, even though the package solution has been described with particular reference to a MOSFET device, it can also find advantageous application for different semiconductor devices, in which passivation regions are present overlying metallization lines that protrude on the surface of the corresponding die, as well as interposed contact regions that have to be biased at different voltages.

Further, the various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A semiconductor power device comprising:
a semiconductor die having a front surface and a rear surface, an arrangement of projecting regions being defined at the front surface, the projecting regions defining windows, wherein contact regions are located in the windows, respectively;
a package housing the semiconductor die, the package including:
a frame of metal material having a top surface and a bottom surface, the semiconductor die coupled to the top surface of the frame; and
an encapsulation material on the frame and the semiconductor die; and
a first multilayer stack arranged above the semiconductor die and including a first upper metal layer, a first lower metal layer, and a first intermediate insulating layer, wherein the lower metal layer comprises contact projections extending at the windows and electrically contacting the contact regions in the windows, respectively, and wherein insulation regions are interposed between the contact projections and arranged at the projecting regions so as to bypass the projecting regions.

2. The device according to claim 1, wherein the projecting regions are metallization lines coated with passivation regions, and wherein the contact regions are designed to be biased at a potential distinct from the potential of the metallization lines.

3. The device according to claim 2, wherein the insulation regions are trenches between the contact projections and are arranged so as to house the passivation regions coating the metallization lines.

4. The device according to claim 3, wherein a separation gap is present between the passivation regions coating the metallization lines and side and bottom walls of the trenches so that the lower metal layer is not in contact with the passivation regions.

5. The device according to claim 1, wherein the lower metal layer includes a main portion of a metal clip coupled to at least one first lead by a first connecting element, wherein the at least one first lead protrudes from the encapsulation material and is accessible from outside the package for biasing of the contact regions.

6. The device according to claim 1, wherein at least one metal layer, chosen from the upper metal layer of the first multilayer stack or an additional metal layer coupled to the upper metal layer, defines part of a first exposed outer surface of the package.

7. The device according to claim 6, wherein at least part of the bottom surface of the frame defines part of a second exposed outer surface of the package.

8. The device according to claim 1, further comprising a second multilayer stack interposed between the top surface of the frame and the rear surface of the semiconductor die, wherein the second multilayer stack includes a second upper metal layer, a second lower metal layer, and a second intermediate insulating layer.

9. The device according to claim 8, wherein the second upper metal layer of the second multilayer stack is coupled to at least one second lead by a second connecting element, the at least one lead protruding from the encapsulation material and being accessible from outside the package.

10. The device according to claim 1, wherein:
the device is a power MOSFET type;
the package is a surface-mount type;
the projecting regions are metallization lines coated with passivation regions;
the metallization lines are gate lines of the MOSFET, and
the contact regions are source regions of the MOSFET.

11. A process for manufacturing a semiconductor power device, the process comprising:
coupling a semiconductor die to a frame of metal material, the semiconductor die including a plurality of projecting regions at an active surface;
coupling a first multilayer stack to the active surface of the semiconductor die, the first multilayer stack including a first upper metal layer, a first lower metal layer, and a first insulating layer between the first upper metal layer and the first lower metal layer, wherein the first lower metal layer comprises contact projections that extend between the projecting regions of the semiconductor die, wherein insulation regions are interposed between the contact projections and arranged at the projecting regions so as to bypass the projecting regions; and
forming an encapsulation material on the frame and around the semiconductor die and the first multilayer stack.

12. The process according to claim 11, wherein the projecting regions are metallization lines coated with passivation regions; and wherein the contact regions are designed to be biased at a potential distinct from the potential of the metallization lines.

13. The process according to claim 12, wherein the insulation regions are trenches between the contact projections and arranged so as to house the passivation regions coating the metallization lines.

14. The process according to claim 13, prior to coupling the first multilayer stack, the method comprises:
forming the first multilayer stack by coupling the first lower metal layer, the first insulating layer, and the first upper metal layer together; and
forming the trenches by sawing the lower metal layer.

15. The process according to claim 13, wherein first multilayer stack comprises:
depositing adhesive strips on the first insulating layer, the adhesive strips being arranged and shaped in a way corresponding to the passivation regions coating the metallization lines and having empty spaces therebetween;
coupling the first lower metal layer to the first intermediate insulating layer so as to fill the empty spaces and define the contact projections; and
subsequently removing the adhesive strips by detachment and separation from the intermediate insulating layer so as to define the trenches.

16. The process according to claim 11, comprising coupling the first lower metal layer of the first multilayer stack to at least one first lead that protrudes from the encapsulation material and is accessible from outside of the package by a connecting element.

17. The process according to claim 11, further comprising:
forming a second multilayer stack interposed between a surface of the frame and a rear surface of the semiconductor die, the second multiplayer stack including a second upper metal layer, a second lower metal layer, and a second intermediate insulating layer; and
coupling the second upper metal layer of the second multilayer stack to at least one second lead that protrudes from the encapsulation material, the at least one second lead being accessible from outside the package by a connecting element.

18. The process according to claim 11, wherein forming the encapsulation material comprising forming the encapsulation material so that a bottom surface of the frame forms an exposed outer surface of the package.

19. A semiconductor power device comprising:
a semiconductor package including:
a semiconductor die having an active surface and a plurality of projecting regions at the active surface, wherein contact regions are located between adjacent ones of the plurality of projecting regions;
a frame of metal frame, the semiconductor die coupled to the metal frame; and
an encapsulation material over the frame and the die; and
a multilayer stack arranged over the active surface, the multilayer stack including an upper metal layer, a lower metal layer, and an insulating layer between the upper and lower metal layers, wherein the lower metal layer comprises a plurality of contact projections that extend between the projecting regions of the semiconductor die, wherein insulation regions are provided at the plurality contact projections.

20. The device according to claim 19, wherein the projecting regions are metallization lines coated with passivation regions, and wherein the contact regions are designed to be biased at a potential distinct from the potential of the metallization lines.

* * * * *

UNITED STATES PATENT AND TRADEMARK OFFICE
CERTIFICATE OF CORRECTION

PATENT NO. : 10,720,373 B2
APPLICATION NO. : 16/370193
DATED : July 21, 2020
INVENTOR(S) : Francesco Salamone et al.

It is certified that error appears in the above-identified patent and that said Letters Patent is hereby corrected as shown below:

In the Claims

Column 10, Line 22, Claim 17:
"multiplayer" should read, --multilayer--.

Signed and Sealed this
Fifteenth Day of September, 2020

Andrei Iancu
*Director of the United States Patent and Trademark Office*